United States Patent [19]
Noto et al.

[11] Patent Number: 5,410,789
[45] Date of Patent: May 2, 1995

[54] METHOD OF MANUFACTURING PIEZOELECTRIC-RESONATOR HAVING VIBRATING SPACES FORMED THEREIN

[75] Inventors: Kazuyuki Noto; Jiro Miyazaki; Taketoshi Hino; Daisaku Kugou, all of Kyoto, Japan

[73] Assignee: Murata Manufacturing Co., Ltd, Nagaokakyo, Japan

[21] Appl. No.: 150,848

[22] Filed: Nov. 12, 1993

[30] Foreign Application Priority Data

Nov. 13, 1992 [JP] Japan ............................. 4-303326
Nov. 13, 1992 [JP] Japan ............................. 4-303327
Apr. 16, 1993 [JP] Japan ............................. 5-089955

[51] Int. Cl.⁶ ..................... H01L 41/22; H01L 41/08
[52] U.S. Cl. ................................. 29/25.35; 310/340
[58] Field of Search ............... 29/25.35, 416, 856; 174/50.54, 50.61, 50.62; 310/320, 340, 344, 348

[56] References Cited

U.S. PATENT DOCUMENTS

| | | | |
|---|---|---|---|
| 4,445,256 | 5/1984 | Huguenin et al. | 174/50.54 X |
| 4,571,794 | 2/1986 | Nakamura | 29/25.35 |
| 4,627,533 | 12/1986 | Pollard | 29/25.35 X |
| 4,920,641 | 5/1990 | Nakamura | 29/856 |
| 5,121,024 | 6/1992 | Seto | 310/320 |
| 5,184,043 | 2/1993 | Yoshinaga | 310/340 X |

FOREIGN PATENT DOCUMENTS

| | | | |
|---|---|---|---|
| 10046 | 4/1980 | European Pat. Off. | 29/25.35 |
| 52-21823 | 2/1977 | Japan | 29/25.35 |
| 55-13581 | 1/1980 | Japan | 310/340 |
| 63-156376 | 6/1988 | Japan | 29/25.35 |
| 2196479 | 8/1990 | Japan | 29/25.35 |

OTHER PUBLICATIONS

"Monolithic Clock Oscillator" Polinski et al, vol. 1, No. 1, Motorola Technical Disclosure Bulletin, Aug. 1980, p. 8.

*Primary Examiner*—Peter Dungba Vo
*Attorney, Agent, or Firm*—Ostrolenk, Faber, Gerb & Soffen

[57] ABSTRACT

In a chip-type piezoelectric-resonator, which is protected with thermosetting resin, mother sheets are bonded to cover both major surfaces of a mother substrate having a plurality of piezoelectric resonance elements which are provided on a piezoelectric substrate, in order to properly form vibrating spaces. The mother sheets are provided with concave portions for defining cavities for vibration. Then, protective resin is applied to cover the mother substrate which is bonded with the mother sheets, and thereafter the mother substrate is divided so as to obtain a plurality of chip-type piezoelectric-resonators.

8 Claims, 8 Drawing Sheets

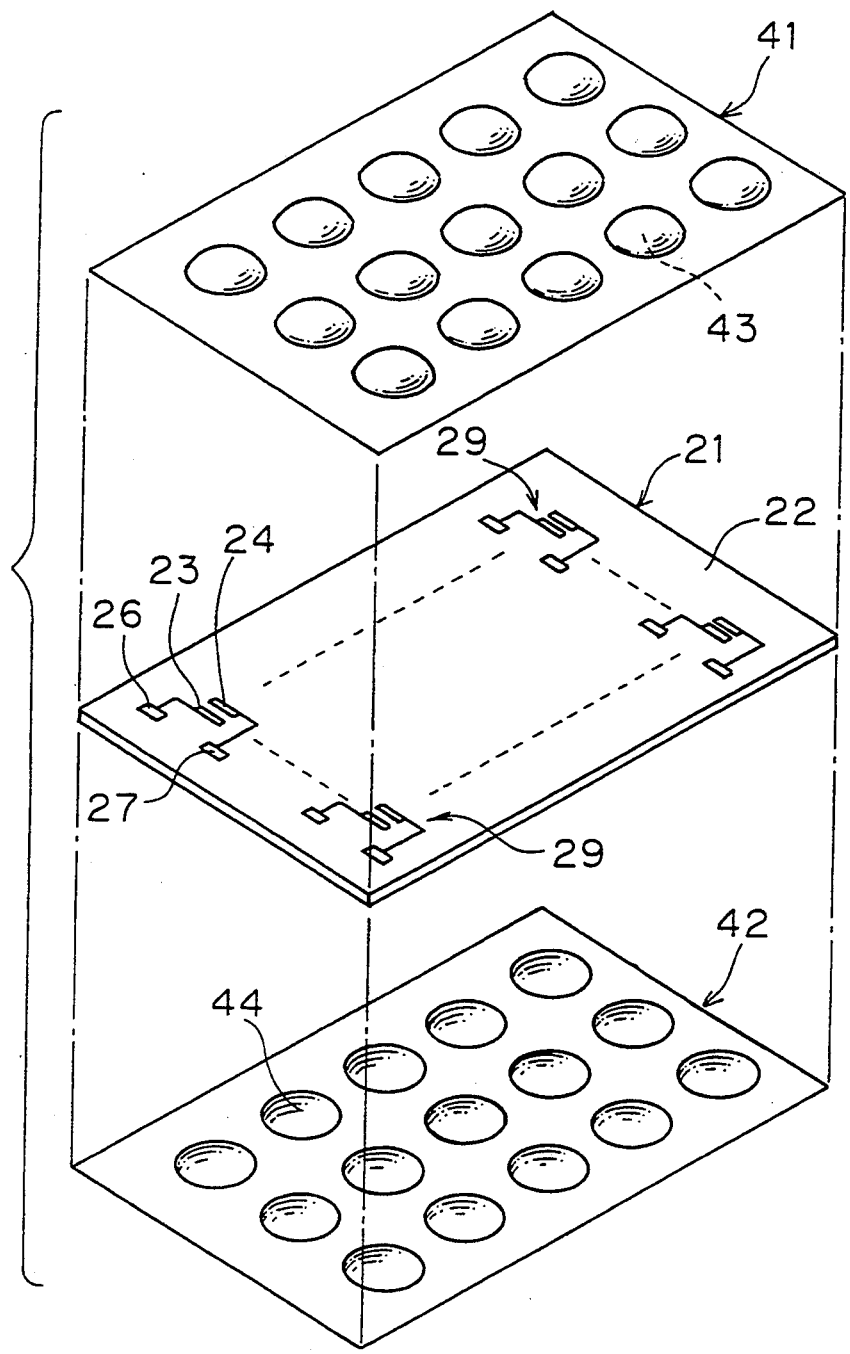

METHOD OF MANUFACTURING PIEZOELECTRIC-RESONATOR HAVING VIBRATING SPACES FORMED THEREIN

BACKGROUND OF THE INVENTION

Field of the Invention

The present invention relates to a method of manufacturing a piezoelectric-resonator, which is applied to a filter, a vibrator or a discriminator, for example.

Description of the Background Art

Conventionally, a piezoelectric-resonator which is applied to a filter, a vibrator or a discriminator is provided with a lead wire.

In recent years, however, a surface mounting technique has been employed for miniaturizing electronic devices, leading to a requirement for a chip-type piezoelectric-resonator provided with no lead wire.

SUMMARY OF THE INVENTION

Accordingly, an object of the present invention is to provide a method of manufacturing a piezoelectric-resonator.

This and other objects of the present invention are achieved by a method of manufacturing a piezoelectric-resonator, which comprises the following steps:

Preparing a piezoelectric resonance element having a piezoelectric substrate, vibrating electrodes which are opposed to each other through the piezoelectric substrate and terminal electrodes which are connected to the vibrating electrodes, and a sheet. The sheet is bonded onto each major surface of the piezoelectric substrate in a region excluding a vibrating region of the piezoelectric resonance element. Further, the sheet is provided with a concave portion, which prevents the sheet from coming into contact with the vibrating region of the piezoelectric resonance element. Further, protective resin is applied to cover each major surface of the piezoelectric substrate with the sheet interposed therebetween.

Thus, according to the present invention, a cavity is defined at the vibrating region of the piezoelectric resonance element by the concave portion which is formed on the sheet. According to the present invention, therefore, it is not necessary to use any cavity forming material such as wax. Consequently, it is possible to solve all the problems caused in the aforementioned case, which employs a cavity forming material. In particular, it is possible to select the material for the protective resin with no regard to its capability of absorbing a cavity forming material, whereby the range of selection of the protective resin can be widened in response to the application of the piezoelectric-resonator, while it is possible to employ protective resin having excellent moisture resistance and solvent resistance with no problem.

The aforementioned concave portion may be formed by partially swelling the sheet, or within a range of its thickness.

The step of forming the concave portion in the sheet may be carried out before, after or in an intermediate stage of the step of bonding the sheet onto each major surface of the piezoelectric substrate.

When the step of forming the concave portion in the sheet is carried out after the step of bonding the sheet onto each major surface of the piezoelectric substrate, the sheet is preferably formed by a laminate sheet which is provided with surfaces having relatively different thermal expansion coefficients. When this laminate sheet is bonded onto each major surface of the piezoelectric substrate, the surface having a relatively low thermal expansion coefficient is directed toward piezoelectric substrate and the sheet is then heated, whereby the concave portion is formed in the sheet on the basis of the difference in thermal expansion coefficient. If the protective resin member is prepared from thermosetting resin, the laminate sheet may be heated in a heating step for hardening the thermosetting resin so that the concave portion is formed in the aforementioned manner.

When the step of forming the concave portion in the sheet is carried out in an intermediate stage of the step of bonding the sheet onto each major surface of the piezoelectric substrate, the sheet is prepared from thermoplastic resin and heated so that a region corresponding to the vibrating region of the piezoelectric resonance element is swollen by vacuum suction during the heating and the sheet is bonded to the piezoelectric substrate under pressure in a portion excluding the swollen portion.

The present invention is preferably carried out to handle a mother substrate which is provided with a plurality of piezoelectric resonance elements. In this case, the sheet is sized so as to cover the plurality of piezoelectric resonance elements which are provided on the mother substrate, and the mother substrate is finally divided into individual piezoelectric resonance elements with the sheet and the protective resin so that terminal electrodes are exposed on divided surfaces.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is an exploded perspective view illustrating a mother substrate 21 and first and second mother sheets 41 and 42 which are prepared in order to obtain the chip-type piezoelectric-resonator 20 shown in FIG. 1;

FIG. 10 is a perspective view illustrating the chip-type piezoelectric-resonator 20 shown in FIG. 1, which is provided with other types of external electrodes 38a to 40a;

DESCRIPTION OF THE PREFERRED EMBODIMENTS

Figure 15:
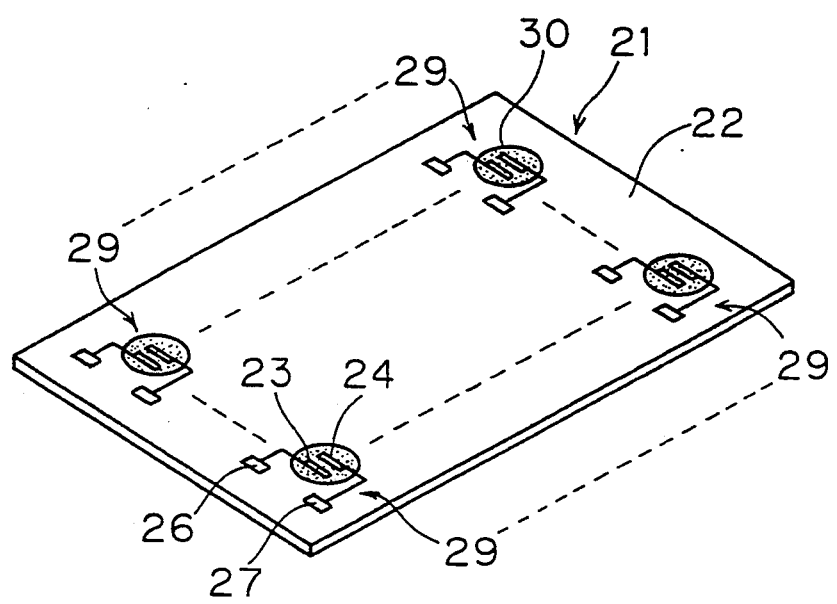
FIG. 15 is a perspective view showing a mother substrate 21 which is employed in a method of manufacturing a chip-type piezoelectric-resonator disclosed in a related Japanese patent application.

A method of efficiently manufacturing a chip-type piezoelectric-resonator has been proposed in Japanese Patent Application No. 4-184442 filed on Jun. 18, 1992 (published on Jan. 14, 1994). FIG. 15 shows a mother substrate 21 which is employed in the method described in this application.

The mother substrate 21 comprises a piezoelectric substrate 22 of piezoelectric ceramic, which has split vibrating electrodes 23 and 24 provided on one major surface and vibrating electrodes (not shown) provided on the other major surface thereof so as to be opposed to the vibrating electrodes 23 and 24. The vibrating electrodes 23 and 24 and those provided on the other major surface are connected with terminal electrodes 26 and 27 and other terminal electrodes (not shown), respectively. Each set of such vibrating electrodes and terminal electrodes form a single piezoelectric resonance element 29, and the mother substrate 21 provides a plurality of such piezoelectric resonance elements 29.

Each piezoelectric resonance element 29 is an energy trapping type double mode piezoelectric-resonator that operates in a thickness vibration mode, which has the split vibrating electrodes 23 and 24, and the vibrating electrodes opposed thereto. In order to ensure a vibrating space of the piezoelectric resonance element 29, a material 30 of wax, for example, which forms a cavity, is provided so as to cover each vibrating region of the piezoelectric substrate 22.

Thereafter, the mother substrate 21 is fitted in a frame (not shown), so that protective resin can be introduced to cover each major surface of the mother substrate 21 in this state. Then, the protective resin is heated so that the material 30 for forming each cavity migrates into the protective resin thereby defining a cavity for serving as a vibrating space. The protective resin is then hardened. Thereafter, the mother substrate 21 covered with the protective resin is divided into the individual piezoelectric resonance elements 29, and external electrodes are provided that are connected to the terminal electrodes 26 and 27, which are exposed on the divided surfaces.

Thus, it is possible to efficiently obtain a number of chip-type piezoelectric-resonators from the single mother substrate 21.

In the method described in the aforementioned patent application, thermosetting protective resin is provided after the material 30, such as wax, for forming cavities is applied to each vibrating region of the piezoelectric substrate 22 so that the cavity forming material 30 migrates into the protective resin when the same is hardened, thereby defining a respective cavity for serving as a vibrating space for each vibrating region of the piezoelectric substrate 22.

In this method, however, the cavity forming material 30 such as wax is applied by instillation, and hence it is difficult to attain high accuracy in relation to the area of application and the shape of such a material. Thus, the cavity forming material 30 may be improperly registered with the corresponding vibrating region. If the cavity forming material 30 is spread beyond a prescribed area or is extremely misregistered when it is applied by instillation, a part of the cavity defined by the cavity forming material 30 may disadvantageously be exposed on a divided surface of the individual piezoelectric resonance element upon division of the mother substrate 21. In this case, the piezoelectric-resonator formed cannot serve its function.

Furthermore, when the cavity forming material 30 is prepared from wax, the wax absorbed by the protective resin may be gasified by heat, which is applied in a later step of forming external electrodes, so as to hinder formation of the external electrodes.

If the cavity forming material 30 is insufficiently absorbed in the protective resin and left on the piezoelectric substrate 22, the characteristics of the piezoelectric-resonator formed may be badly influenced by the part of the cavity forming material 30 remaining on the piezoelectric substrate 22.

On the other hand, the protective resin must be capable of sufficiently absorbing the cavity forming material 30. Therefore, the protective resin contains a number of small bubbles. However, such capability of absorbing the cavity forming material 30 deteriorates moisture resistance and solvent resistance of the protective resin. Consequently, it is difficult to employ the piezoelectric-resonator in a field requiring moisture resistance or solvent resistance. At any rate, when the piezoelectric-resonator must be directed to such use, it may be necessary to cover the protective resin with another protective resin, which is excellent in moisture resistance and solvent resistance.

Figure 1:
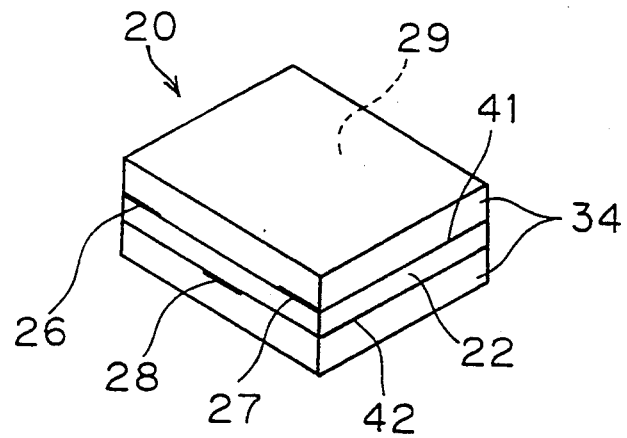
FIG. 1 is a perspective view showing appearance of a chip-type piezoelectric-resonator 20 which is obtained according to an embodiment of the present invention.

FIG. 1 is a perspective view showing a chip-type piezoelectric-resonator 20 which is obtained by a method according to an embodiment of the present invention. In order to obtain such a piezoelectric-resonator 20, steps shown in FIGS. 2 to 8 are carried out.

Figure 3:
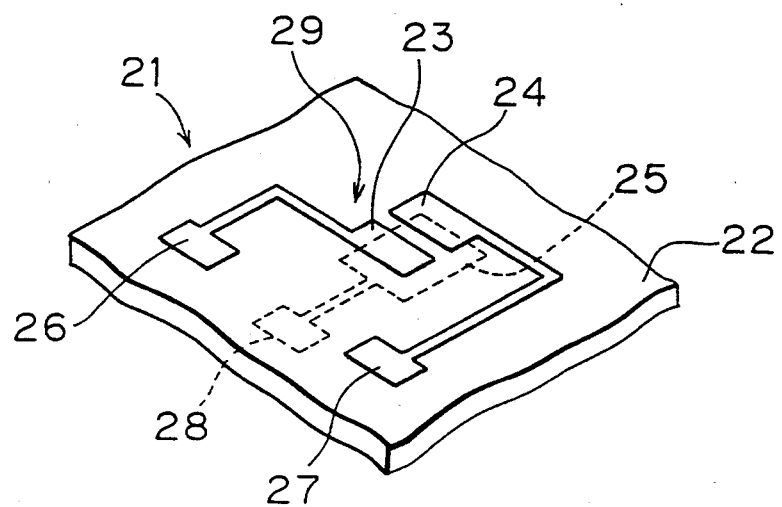
FIG. 3 is a perspective view illustrating a part of the mother substrate 21, shown in FIG. 2, in an enlarged manner.

First, a mother substrate 21 is prepared as shown in FIG. 2. FIG. 3 shows a part of this mother substrate 21 in an enlarged manner. As to elements which are included in the mother substrate 21, those corresponding to the elements shown in FIG. 15 are denoted by similar reference numerals.

The mother substrate 21 comprises a piezoelectric substrate 22 of piezoelectric ceramic, which has split vibrating electrodes 23 and 24 provided on one major surface and other vibrating electrodes 25 provided on the other major surface so as to be opposed to the vibrating electrodes 23 and 24. The vibrating electrodes 23, 24 and 25 are connected with terminal electrodes 26, 27 and 28 respectively. Each set of the vibrating electrodes 23 to 25 and the terminal electrodes 26 to 28 form a single piezoelectric resonance element 29, and the mother substrate 21 provides a plurality of such piezoelectric resonance elements 29.

Each piezoelectric resonance element 29 is an energy trapping type double mode piezoelectric-resonator utilizing a thickness vibration mode, which has the split vibrating electrodes 23 and 24 and the vibrating electrode 25 opposed thereto, similarly to that shown in FIG. 15.

As shown in FIG. 2, first and second mother sheets 41 and 42 are so prepared as to cover the major surfaces of the mother substrate 21 respectively. The mother sheets 41 and 42 are provided with plural concave portions 43 and 44, which are formed by embossing, for example, in order to define cavities on respective vibrating regions of the plurality of piezoelectric resonance elements 29 formed on the aforementioned mother substrate 21. These mother sheets 41 and 42, preferably having insulating properties, are formed by thin resin sheets or papers, for example. Further, the mother sheets 41 and 42 preferably have the same outside dimensions as the mother substrate 21. While the concave portions 43 and 44 are shown as being formed by providing dome-type swollen portions in the mother sheets 41 and 42, these concave portions 43 and 44 may have other shapes.

As shown in FIG. 2, the mother sheets 41 and 42 are arranged so as to direct the respective concave portions 43 and 44 toward the mother substrate 21, and are bonded to the respective major surfaces of the mother substrate 21 with adhesives (not shown) in this state. At this time, the mother sheets 41 and 42 are bonded to the mother substrate 21 in overall regions excluding the concave portions 43 and 44. When the mother substrate 21 and the mother sheets 41 and 42 have outside dimensions which are equal to each other as hereinabove described, it is possible to easily register these elements with each other in such a bonding step on the basis of their outlines.

Figure 4:
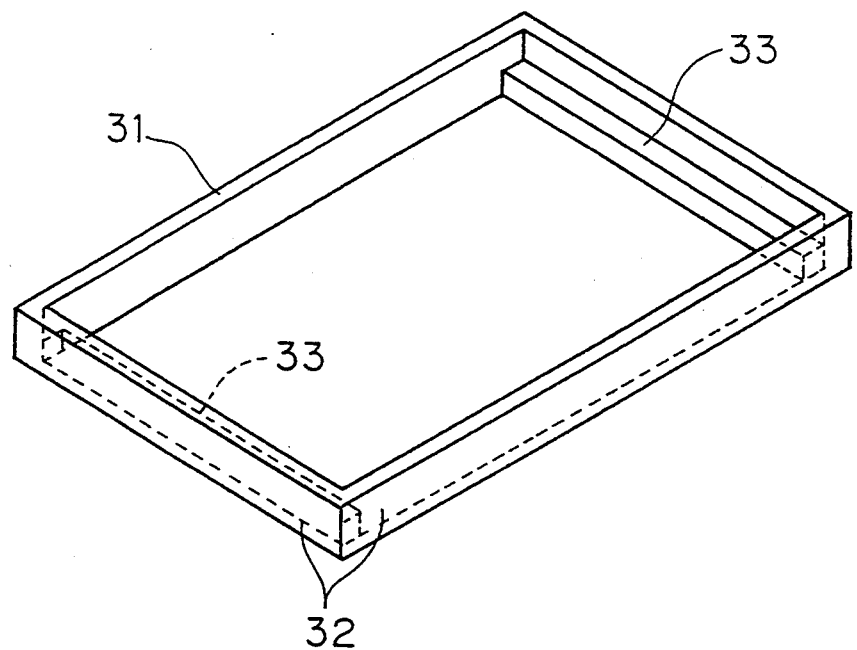
FIG. 4 is a perspective view illustrating a frame 31 which is employed in order to obtain the chip-type piezoelectric-resonator 20 shown in FIG. 1.

On the other hand, a frame 31 of resin, for example, which can substantially tightly receive the aforementioned mother substrate 21 is prepared as shown in FIG. 4. This frame 31 is prepared so that the same is neither deformed nor fused by a temperature of about 150° C., for example, for heating and hardening the protective resin as described later. Outer side surfaces 32 of this frame 31 are preferably planar if the same are employed as reference surfaces in a cutting step as described later.

The frame 31 is preferably provided with means which can fix the mother substrate 21, as received therein substantially at a central portion along the thickness of the frame 31. According to this embodiment, shelves or ledges 33 are provided inside opposite sides (shorter sides, for example) of the frame 31.

Figure 5:
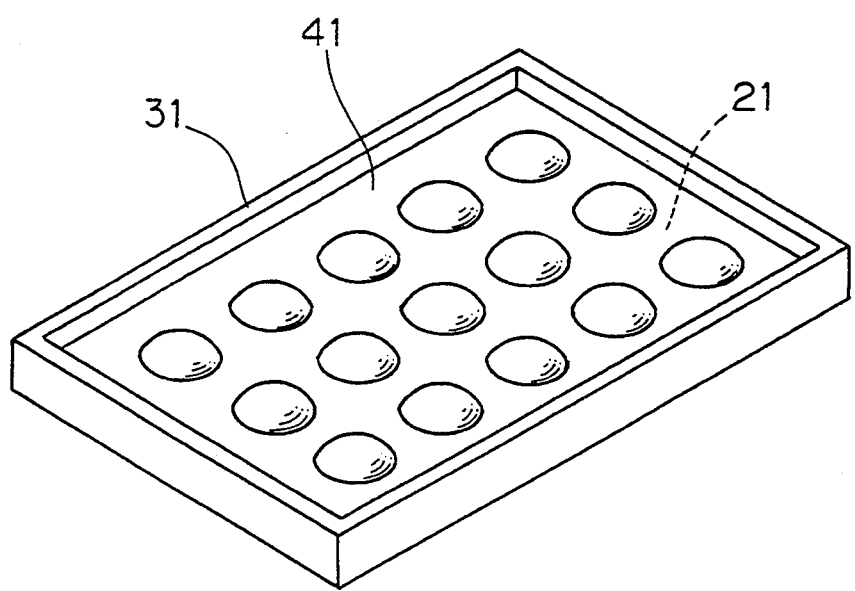
FIG. 5 is a perspective view illustrating a state in which the mother substrate 21 and the mother sheets 41 and 42 are fitted in the frame 31 shown in FIG. 4.
Figure 6:
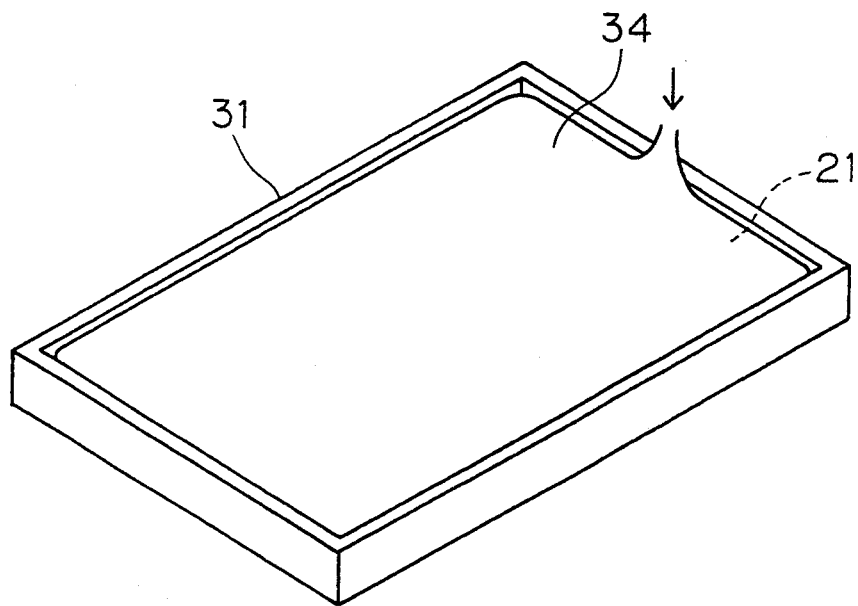
FIG. 6 is a perspective view illustrating a state in which protective resin 34 is introduced onto the mother sheet 41 shown in FIG. 5.

The mother substrate 21, which is covered with the aforementioned mother sheets 41 and 42, is fitted in the frame 31 as shown in FIG. 5, and unhardened protective resin 34 is introduced onto one surface of the mother substrate 21, i.e., onto the first mother sheet 41, in this state, as shown in FIG. 6. This protective resin 34 is prepared an epoxy thermosetting resin which is liquefied with a solvent, for example, with addition of a proper amount of a filler such as silica or talc, for example. The protective resin 34 is naturally dried, for example, so that it will not flow out when the frame 31 is inverted with the mother substrate 21. Thereafter, the frame 31 is inverted With the mother substrate 21 and the protective resin 34, and another protective resin 34 is introduced onto the other surface of the mother substrate 21, i.e., onto the second mother sheet 42. This protective resin 34 is also naturally dried, for example.

In place of inserting the mother sheets 41 and 42 and the mother substrate 21 in the frame 31 in an already superposed state as described above, either mother sheet 41 or 42 may be inserted in the frame 31 first and then the mother substrate 21 and the other mother sheet 42 or 41 may then successively be inserted therein, in order to utilize the frame 31 as a guide for registering these elements with each other.

Figure 7:
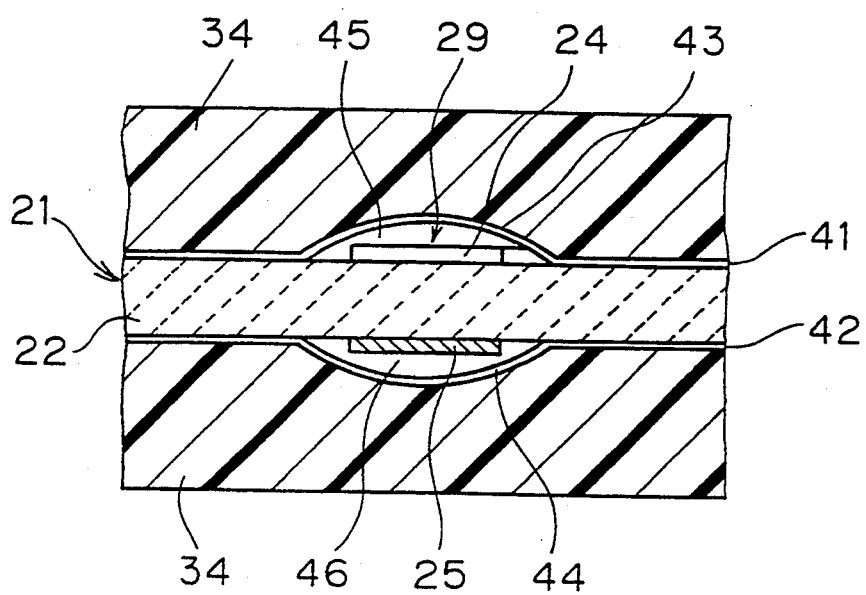
FIG. 7 is an enlarged sectional view showing a part of a structure which is obtained by hardening the protective resin 34.

Then, the protective resin 34 which is introduced in two stages as described above is heated at a temperature of 150° C. for 30 minutes, for example, so as to be hardened. FIG. 7 is an enlarged sectional view showing a structure which is obtained at this time. As shown in FIG. 7, cavities 45 and 46 are defined on a vibrating region of each piezoelectric resonance element 29 by the concave portions 43 and 44 of the first and second mother sheets 41 and 42 respectively.

Figure 8:
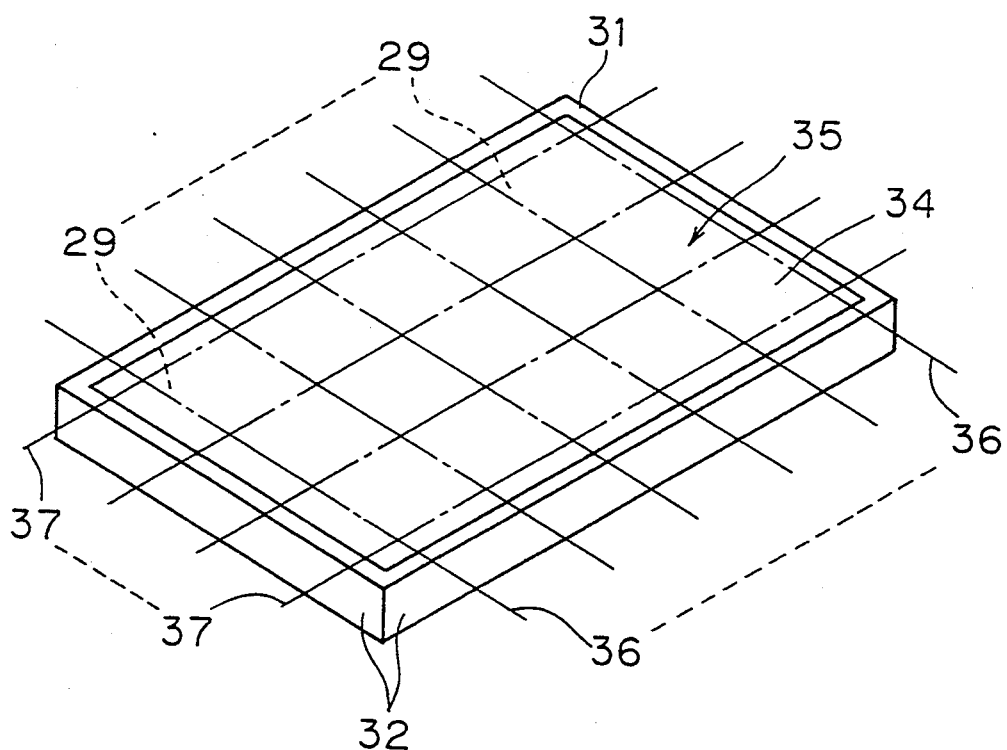
FIG. 8 is a perspective view for illustrating a step of cutting a sandwich structure 35 which is obtained after hardening and polishing the protective resin 34.

Then, each outer surface of the protective resin 34 is polished with the frame 31, in order to improve the chip-type piezoelectric-resonator 20 (FIG. 1) obtained in dimensional accuracy along the thickness direction and flatness. This polishing step is carried out through lapping with a polishing plate, for example. Thus obtained is a sandwich structure 35, as shown in FIG. 8, comprising the mother substrate 21 which is covered with the protective resin 34 on each surface.

Then, this sandwich structure 35 is cut with the frame 31 along cutting lines 36 and 37 with reference to the outer side surfaces 32 of the frame 31. Thus, the mother substrate 21 is divided with the protective resin 34 and the mother sheets 41 and 42 into the individual piezoelectric resonance elements 29, so that the terminal electrodes 26 to 28 are exposed on the cut surfaces. Thus, the chip-type piezoelectric-resonator 20 shown in FIG. 1 is obtained.

The aforementioned polishing and cutting steps may alternatively be carried out after the sandwich structure 35 is taken out from the frame 31.

Figure 9:
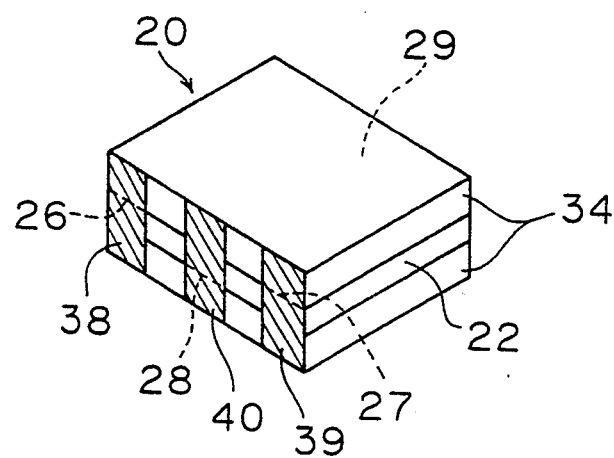
FIG. 9 is a perspective view illustrating the chip-type piezoelectric-resonator 20 shown in FIG. 1, which is provided with external electrodes 38 to 40.

Then, external electrodes 38 to 40 are provided on at least a surface having the exposed terminal electrodes 26 to 28 by printing and baking conductive paste, for example, for conducting with the terminal electrodes 26 to 28, respectively, as shown in FIG. 9.

While all terminal electrodes 26 to 28 of the chip-type piezoelectric-resonator 20 are exposed on the same surface according to this embodiment, such terminal electrodes may alternatively be exposed on separate surfaces. In this case, external electrodes may be provided on these surfaces respectively.

Figure 10:
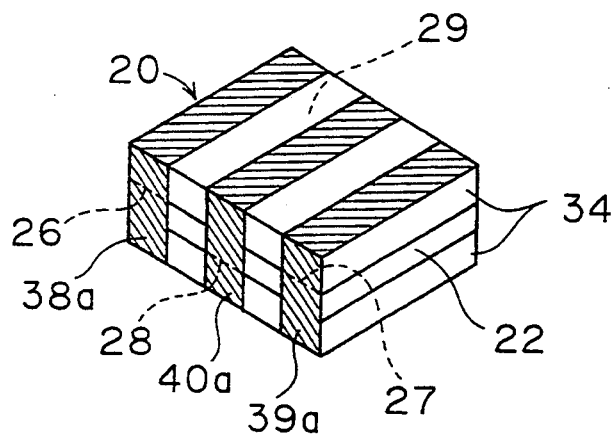

As shown in FIG. 10, external electrodes 38a, 39a and 40a for conducting with the terminal electrodes 26 to 28 of the chip-type piezoelectric-resonator 20 may be formed to extend not only along one side surface of the chip-type piezoelectric-resonator 20 but toward at least one of upper and lower surfaces as well as to the other side surface. In this case, it is possible to reliably solder the chip-type piezoelectric-resonator 20 in order to mount the same on a circuit board. In such external electrodes 38a to 40a, parts which are formed on the upper and/or lower surface of the chip-type piezoelectric-resonator 20 may be previously provided in the state of the sandwich structure 35 shown in FIG. 8, by printing and baking conductive paste or the like.

While the frame 31 is employed in the aforementioned embodiment in order to apply the thermosetting protective resin 34 for covering the mother substrate 21 which is bonded with the mother sheets 41 and 42, a dip system may be employed in place of this means. In such a system, a mother substrate which is bonded with mother sheets is dipped in liquid thermosetting resin and thereafter taken out to be then subjected to heating, hardening, polishing and cutting steps, thereby obtaining a piezoelectric-resonator which is substantially similar to the chip-type piezoelectric-resonator 20 shown in FIG. 1.

Figure 11:
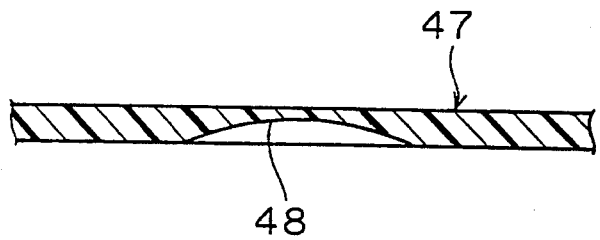
FIG. 11 is an enlarged sectional view showing a part of a mother sheet 47 which is employed in another embodiment of the present invention.

FIG. 11 is an enlarged sectional view showing a part of a mother sheet 47 which can be employed in place of each of the aforementioned mother sheets 41 and 42. This mother sheet 47 is formed by a relatively thick sheet, and each concave portion 48 is formed within a range of its thickness. In this case, it is possible to easily form the concave portion 48 if the mother sheet 47 is made of resin.

When the mother sheet 41, 42 or 47 is made of a material having excellent vibration absorptivity, it is possible to absorb unnecessary spurious vibration, thereby further improving the characteristics of the chip-type piezoelectric-resonator obtained.

Figure 12:
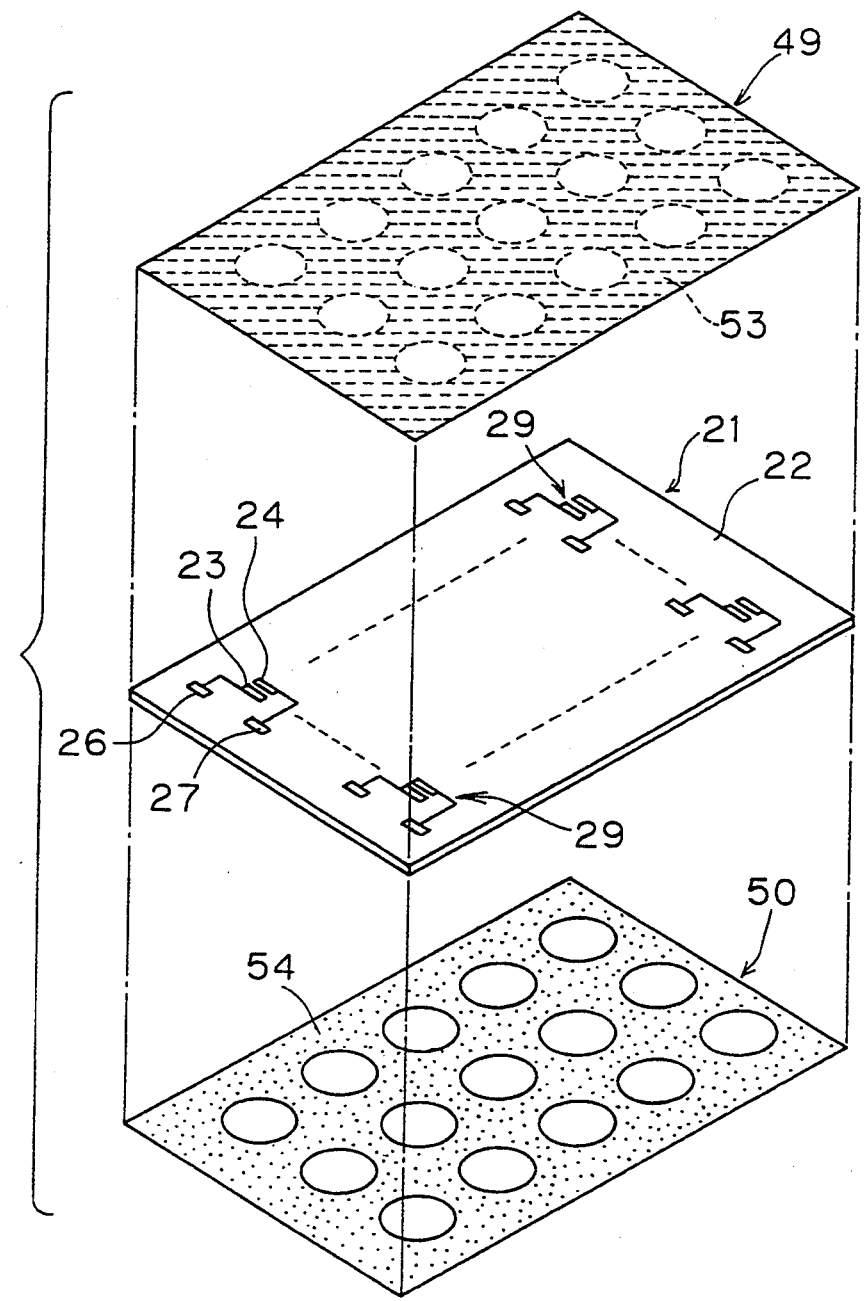
FIG. 12 is an exploded perspective view corresponding to FIG. 2, for illustrating still another embodiment of the present invention.

FIG. 12 is an exploded perspective view, corresponding to FIG. 2, for illustrating still another embodiment of the present invention. The mother substrate 21 shown in FIG. 12 is substantially identical to the mother substrate 21 shown in FIG. 2. In the following description, elements, which are included in the mother substrate 21, corresponding to those shown in FIGS. 2 and 3 are denoted by similar reference numerals, to omit redundant description.

Figure 13:
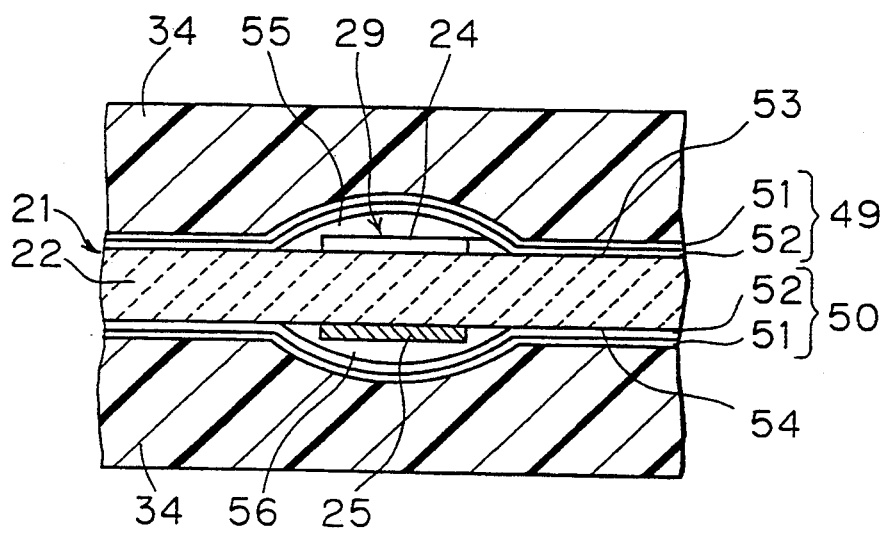
FIG. 13 is an enlarged sectional view for illustrating a step of forming vibrating spaces in the embodiment shown in FIG. 12.

In the embodiment shown in FIG. 12, first and second laminate sheets 49 and 50 are prepared in place of the first and second mother sheets 41 and 42 shown in FIG. 2. Each of these laminate sheets 49 and 50 is provided with surfaces having relatively different thermal expansion coefficients. In more concrete terms, each of the laminate sheets 49 and 50 has a two-layer structure including a high thermal expansion coefficient layer 51 and a low thermal expansion coefficient layer 52, as shown in FIG. 13. Alternatively, each of the laminate sheets 49 and 50 may have three or more layers, so far as it has surfaces having relatively different thermal expansion coefficients.

Referring to FIG. 12, the low thermal expansion coefficient layers 52 of the first and second laminate sheets 49 and 50 are directed major surfaces of the mother substrate 21 respectively. An adhesive 53 is applied to the lower surface of the first laminate sheet 49 in regions excluding those corresponding to the vibrating regions of the piezoelectric substrate 22, i.e., in regions hatched with broken lines in FIG. 12. On the other hand, an adhesive 54 is applied to the upper surface of the second laminate sheet 50 in dotted regions appearing in FIG. 12, in a similar manner to the first laminate sheet 49. Then, the first and second laminate sheets 49 and 50 are bonded to the major surfaces of the mother substrate 21 respectively. At this time, the laminate sheets 49 and 50 adhere to the piezoelectric substrate 22 in the regions excluding the vibrating regions thereof.

The adhesives 53 and 54 may alternatively be applied onto the mother substrate 21, so that the laminate sheets 49 and 50 are thereafter bonded to the same.

Also according to this embodiment, steps substantially similar to the aforementioned steps shown in FIGS. 5 and 6 are carried out. Protective resin 34, which is introduced in a step corresponding to that shown in FIG. 6, is heated so as to be hardened. At this time, the laminate sheets 49 and 50 are deformed so that the portions not bonded to the piezoelectric substrate 22 are separated from the piozoelectric substrate 22 on the basis of the difference in thermal expansion coefficients between the high thermal expansion coefficient layers 51 and the low thermal expansion coefficient layers 52, thereby defining vibrating spaces 55 and 56 on each vibrating region of the piezoelectric substrate 22, as shown in FIG. 13. The protective resin 34 is hardened at the same time.

Thereafter, steps similar to those of the aforementioned embodiment are carried out, to obtain desired chip-type piezoelectric-resonators.

Figure 14:
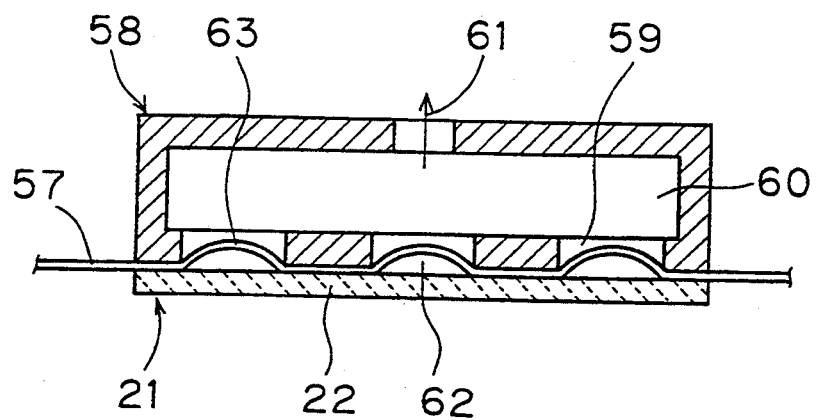
FIG. 14 is a sectional view for illustrating a step of forming vibrating spaces in a further embodiment of the present invention.

FIG. 14 is a sectional view for illustrating a further embodiment of the present invention. Referring to FIG. 14, elements corresponding to the aforementioned ones are denoted by similar reference numerals.

According to this embodiment, a sheet 57 of thermoplastic resin is prepared and superposed on one major surface of a piezoelectric substrate 22, i.e., a mother substrate 21. In this state, a working head 58 is arranged on the sheet 57. This working head 58 comprises a cavity 60 which is provided with openings 59 in regions corresponding to vibrating regions on the mother substrate 21. The working head 58 also has a function of heating the sheet 57 with a heater (not shown).

As shown in FIG. 14, the working head 58 presses the sheet 57 against the mother substrate 21, while the cavity 60 is supplied with a negative pressure i.e., a vacuum as shown by arrow 61, and the sheet 57 is heated. Thus, the sheet 57 is swollen by vacuum suction in portions located at the openings 59, thereby forming swollen portions 63 for defining cavities 62 on the vibrating regions of the mother substrate 21. At the same time, the sheet 57 is bonded to the mother substrate 21 under pressure in portions excluding the swollen portions 63. This bonding may alternatively be implemented by thermally welding the material for the sheet 57 itself, or with a hot melt type adhesive which is applied onto the sheet 57.

The aforementioned step of forming cavities is similarly repeated on another major surface of the mother substrate 21. Portions of the sheet 57 jutting out from the mother substrate 21 are removed by cutting, if necessary.

Thereafter steps corresponding to those shown in FIG. 5 and the following figures are carried out similarly to the embodiment described with reference to FIGS. 1 to 8, to obtain a desired chip-type piezoelectric-resonator.

In each of the aforementioned embodiments, the mother substrate 21 is finally divided to efficiently obtain a plurality of chip-type piezoelectric-resonators 20. If such an advantage is not desired, the inventive method may be applied to a piezoelectric substrate for obtaining a single piezoelectric-resonator.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a piezoelectric-resonator comprising the steps of:
    preparing a piezoelectric substrate having two opposed major surfaces;
    providing a piezoelectric resonance element on said piezoelectric substrate, said piezoelectric resonance element including vibrating electrodes disposed on said opposed major surfaces of the piezoelectric substrate, said vibrating electrodes defining a vibrating region and being opposed to each other through said piezoelectric substrate, and terminal electrodes that are connected with said vibrating electrodes;

preparing a pair of sheets;

bonding each of said sheets to a respective major surface of said piezoelectric substrate in a region excluding said vibrating region;

forming a concave portion in each of said sheets, thereby defining a cavity for enclosing said vibrating region so as to prevent said sheets from coming into contact with said vibrating region; and applying protective resin for covering each said major surface of said piezoelectric substrate with said corresponding sheet interposed therebetween.

2. A method of manufacturing a piezoelectric-resonator in accordance with claim 1, wherein said step of forming a concave portion in each said sheet includes a step of forming said concave portion so that a depth of the defined cavity is less than the thickness of said sheet.

3. A method of manufacturing a piezoelectric-resonator in accordance with claim 1, wherein said step of forming a concave portion in each said sheet is carried out in advance of said step of bonding said sheet to said respective major surface of said piezoelectric substrate.

4. A method of manufacturing a piezoelectric-resonator in accordance with claim 1, wherein said step of preparing a piezoelectric resonance element includes a step of preparing a mother substrate that is provided with a plurality of said piezoelectric resonance elements, each said sheet being sized so as to cover said plurality of piezoelectric resonance elements provided on said mother substrate, said method further comprising a step of dividing said mother substrate together with said sheet and said protective resin so as to separate individual ones of said piezoelectric resonance elements and so as to expose said terminal electrodes on divided surfaces thereof.

5. A method of manufacturing a piezoelectric-resonator in accordance with claim 1, wherein said step of forming a concave portion in each sheet includes a step of partially swelling said sheet.

6. A method of manufacturing a piezoelectric-resonator in accordance with claim 2, wherein each said sheet comprises a laminate sheet provided with major surfaces having relatively different thermal expansion coefficients, respectively, a side of said laminate sheet having a relatively lower thermal expansion coefficient being directed toward said piezoelectric substrate in said step of bonding said sheet to said respective major surface of said piezoelectric substrate, said step of forming a concave portion in each said sheet including a step of heating said sheet after said step of bonding said sheet to said respective major surface of said piezoelectric substrate.

7. A method of manufacturing a piezoelectric-resonator in accordance with claim 6, wherein said protective resin a thermosetting resin, said step of heating said sheet includes a heating step for hardening said thermosetting resin.

8. A method of manufacturing a piezoelectric-resonator in accordance with claim 5, wherein each said sheet is made of thermoplastic resin, said step of bonding said sheet to said respective major surface of said piezoelectric substrate and said step of forming a concave portion in each said sheet includes a step of heating said sheet while swelling a region corresponding to said vibrating region by vacuum suction and bonding a portion of said sheet excluding said swollen region to said piezoelectric substrate under pressure.

* * * * *